United States Patent
Chang et al.

(10) Patent No.: US 7,307,018 B2
(45) Date of Patent: Dec. 11, 2007

(54) METHOD OF FABRICATING CONDUCTIVE LINES

(75) Inventors: Jui-Pin Chang, Hsinchu (TW); Chien-Hung Liu, Hsinchu (TW); Ying-Tso Chen, Hsinchu (TW); Shou-Wei Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 21 days.

(21) Appl. No.: 11/236,961

(22) Filed: Sep. 27, 2005

(65) Prior Publication Data
US 2006/0286731 A1 Dec. 21, 2006

(30) Foreign Application Priority Data
Jun. 20, 2005 (TW) .............................. 94120391 A

(51) Int. Cl.
*H01L 21/44* (2006.01)
*H01L 21/4763* (2006.01)
*H01L 21/336* (2006.01)
*H01L 21/8234* (2006.01)

(52) U.S. Cl. ...................... 438/669; 438/595; 438/597; 438/197; 438/619; 438/672; 438/643; 438/648; 257/E21.591; 257/E21.166

(58) Field of Classification Search ................ 438/669, 438/597, 595, 619, 197, 672, 643, 648
See application file for complete search history.

(56) References Cited

U.S. PATENT DOCUMENTS

| | | | | |
|---|---|---|---|---|
| 5,017,515 | A | * | 5/1991 | Gill .............................. 438/128 |
| 5,238,872 | A | | 8/1993 | Thalapaneni ................ 438/453 |
| 5,538,921 | A | * | 7/1996 | Obeng ........................ 438/696 |
| 5,639,688 | A | * | 6/1997 | Delgado et al. ............ 438/586 |
| 6,071,787 | A | * | 6/2000 | Joo ............................. 438/369 |
| 6,083,816 | A | * | 7/2000 | Kanamori ................... 438/585 |
| 6,232,214 | B1 | * | 5/2001 | Lee et al. .................... 438/619 |
| 6,525,342 | B2 | | 2/2003 | Amemiya et al. ........... 257/59 |
| 6,831,007 | B2 | * | 12/2004 | Kim ............................ 438/643 |
| 2003/0166335 | A1 | * | 9/2003 | Kim et al. ................... 438/669 |
| 2004/0203231 | A1 | * | 10/2004 | Hsieh ......................... 438/669 |

* cited by examiner

*Primary Examiner*—Michael Lebentritt
*Assistant Examiner*—Mohsen Ahmadi
(74) *Attorney, Agent, or Firm*—J.C. Patents

(57) ABSTRACT

A method of forming a conductive line suitable for decreasing a sheet resistance of the conductive lines. The method comprises steps of providing a material layer having a conductive layer formed thereon and forming a patterned mask layer on the conductive layer. In addition, a portion of the conductive layer is removed by using the patterned mask layer as a mask and a spacer is formed on a sidewall of the patterned mask layer and the conductive layer. A portion of the conductive layer is removed until the material layer is exposed to form a conductive line, wherein the spacer and the patterned mask layer serve as a mask.

7 Claims, 2 Drawing Sheets

METHOD OF FABRICATING CONDUCTIVE LINES

CROSS-REFERENCE TO RELATED APPLICATION

This application claims the priority benefit of Taiwan application serial no. 94120391, filed on Jun. 20, 2005. All disclosure of the Taiwan application is incorporated herein by reference.

BACKGROUND OF THE INVENTION

1. Field of Invention

The present invention relates to a semiconductor device and the method of manufacturing the same. More particularly, the present invention relates to conductive lines and a method of manufacturing the same.

2. Description of Related Art

In the semiconductor manufacturing processes, the metallization process of the integrated circuits plays a decisive role. Typically, the conductive lines are used to connect the devices to each other. The conventional method of forming the conductive lines comprises forming a metal layer over a semiconductor substrate and then forming a patterned photoresist layer on the metal layer. Further, by using the patterned photoresist layer as a mask, an etching process is performed on the conductive layer to form the conductive lines.

However, as the integration of the integrated circuits keeps increasing, the pattern and the line width of the device are decreased. In addition, with the decreasing of the line width of the conductive line, the sheet resistance of the conductive line is increased. Therefore, the resistance-capacitance delay (RC delay) is increased and the operation speed of the device is adversely affected by the increment of the RC delay.

SUMMARY OF THE INVENTION

Accordingly, at least one objective of the present invention is to provide a method of manufacturing conductive lines, capable of avoiding the sheet resistance of the conductive lines from being increased due to the decreasing of the line width. Hence, the operation speed of the device is not affected. Furthermore, the line width of the conductive line formed by using the method provided by the present invention is relatively small.

At least another objective of the present invention is to provide a conductive line structure capable of decreasing the sheet resistance of the conductive lines. Furthermore, the line space of the conductive line is relatively narrow.

To achieve these and other advantages and in accordance with the purpose of the invention, as embodied and broadly described herein, the invention provides a method of forming a conductive line suitable for decreasing a sheet resistance of the conductive lines. The method comprises steps of providing a substrate having a conductive layer formed thereon and then patterning the conductive layer in a predetermined state. Thereafter, a spacer is formed on the sidewall of the patterned conductive layer and then a portion of the patterned conductive layer is removed until the substrate—is exposed to form a conductive line, wherein the spacer serves as a mask.

In the present invention, the method of forming the spacer comprises steps of forming a spacer material layer over the substrate and performing an etching process to remove a portion of the spacer material layer. Furthermore, the material of the spacer can be silicon nitride, silicon oxide, silicon oxy-nitride or polymer materials. Also, the material of the conductive layer can be doped polysilicon, aluminum, copper or alloys of aluminum and copper. Moreover, the method of forming the conductive layer can be sputtering or chemical vapor deposition. The substrate can be a polysilicon layer, a dielectric layer or a metal layer.

The present invention also provides a conductive line structure. The conductive line structure comprises a first portion of a conductive line and a second portion of the conductive line adjacent to the first conductive layer, wherein a width of the first portion is larger than a width of the second portion.

In the present invention, the material of the first conductive portion and the second conductive portion can be chosen from doped polysilicon, aluminum, copper or alloy of aluminum and copper. Also, the conductive line structure further comprises a mask layer located over the second portion of the conductive line, wherein the material of the mask layer can be titanium/titanium nitride, silicon oxynitride, silicon oxide, silicon nitride or photoresist materials. In addition, the conductive line structure comprises a spacer located over the first portion of the conductive line and on the sidewall of the second portion of the conductive line and the mask layer, wherein the material of the spacer can be silicon oxide, silicon nitride, silicon oxynitride or polymer materials.

The present invention further provides a conductive line structure. The conductive line structure comprises a first portion having a first line width and a second portion having a second line width and located over the first portion. The first line width of the first portion is larger than the second line width of the second portion.

In the present invention, the material of the first portion and the second portion can be doped polysilicon, aluminum, copper or alloys of aluminum and copper. Furthermore, the conductive line structure further comprises a mask layer located over the second portion, wherein the material of the mask layer can be titanium/titanium nitride, silicon oxynitride, silicon oxide, silicon nitride or photoresist materials. Also, the conductive line structure comprises a spacer located on the first portion and on the sidewall of the second portion and the mask layer, wherein the material of the spacer can be silicon oxide, silicon nitride, silicon oxynitride or polymer materials.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A through 1F are schematic diagrams showing the method of manufacturing the conductive lines according to a preferred embodiment of the invention.

Figure 1A:
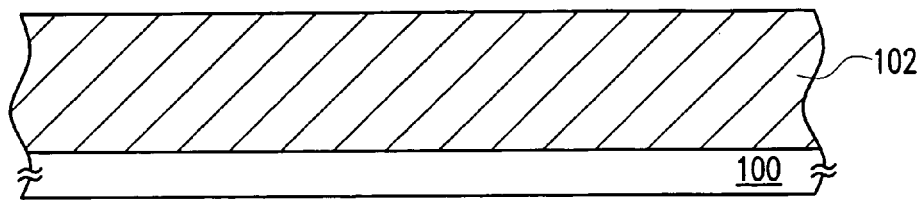
FIGS. 1A through 1F are schematic diagrams showing the method of manufacturing the conductive lines according to a preferred embodiment of the invention.

As shown in FIG. 1A, a substrate 100 is provided. The substrate 100 can be, for example but not limited to, a polysilicon layer, a dielectric layer or a metal layer. Furthermore, the material of the substrate 100 is not limited to the materials recited above as long as the conductive lines can be formed on the material used to form the substrate. In addition, a conductive layer 102 is formed on the substrate 100. The conductive layer can be formed from, for example, doped polysilicon, aluminum, copper or alloys of aluminum and copper, by sputtering or chemical vapor deposition.

Figure 1B:
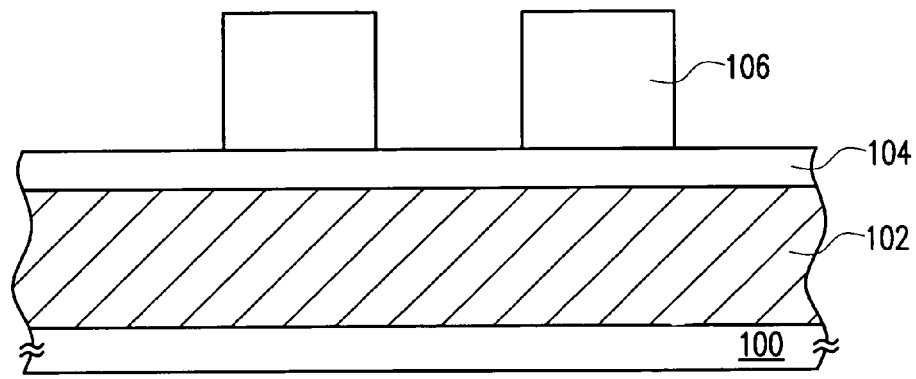
Figure 1C:
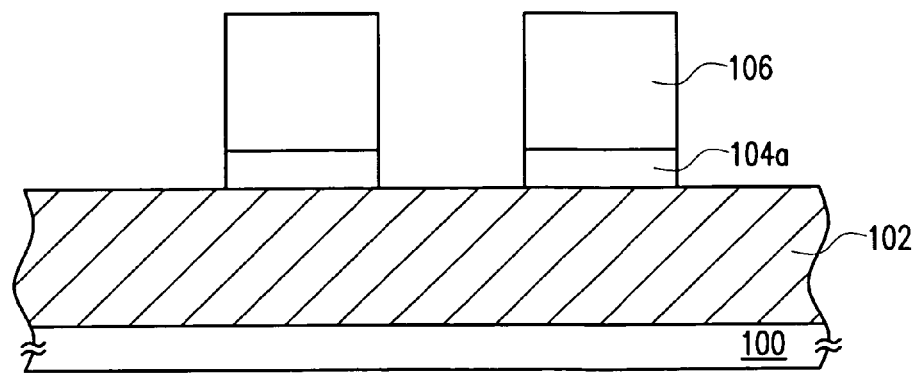

As shown in FIG. 1B, a mask layer 104 is formed on the conductive layer 102. The mask layer 104 can be formed from, for example but not limited to, titanium/titanium nitride, silicon oxide, silicon nitride, silicon oxy-nitride or photoresist materials. A patterned photoresist layer 106 is formed on the mask layer 104. By using the patterned photoresist layer 106 as a mask, a portion of the mask layer 104 is etched until the surface of the conductive layer 102 is exposed, so as to form a patterned mask layer 104a (as shown in FIG. 1C).

Figure 1D:
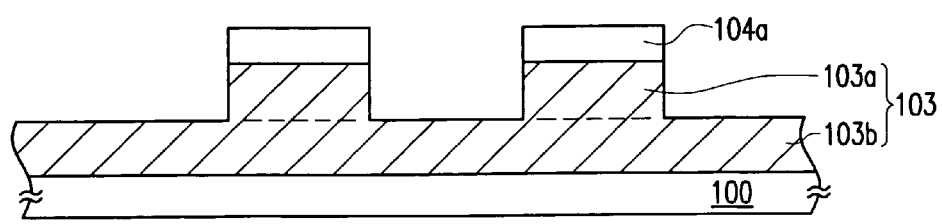

As shown in FIG. 1D, after removing the patterned photoresist layer 106, by using the patterned mask layer 104a as a mask, a portion of the conductive layer 102 is removed to form a conductive layer 103. The conductive layer 103 comprises a conductive layer 103a covered by the patterned mask layer 104a and a conductive layer 103b located on the substrate 100. The method of removing the portion of the conductive layer 102 can be a time-mode etching process. That is, the time for performing the etching process is predetermined and the etching process is stopped while the time is up.

Figure 1E:
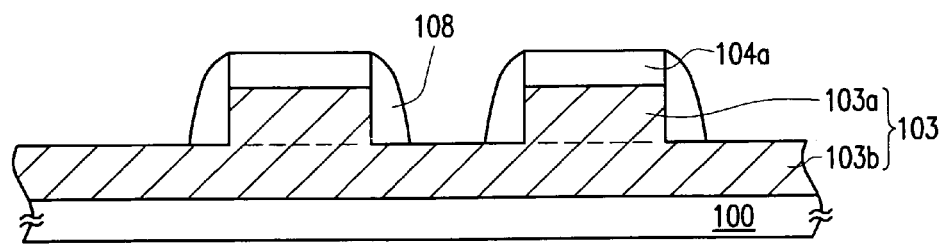

As shown in FIG. 1E, a spacer 108 is formed on the sidewalls of the patterned mask layer 104a and the conductive layer 103a. The method for forming the spacer 108 comprises the steps of forming a spacer material layer (not shown) over the substrate 100 and then performing an etching process to remove a portion of the spacer material layer. Furthermore, the spacer 108 can be made of, for example but not limited to, silicon oxide, silicon nitride, silicon oxy-nitride or polymer materials.

Figure 1F:
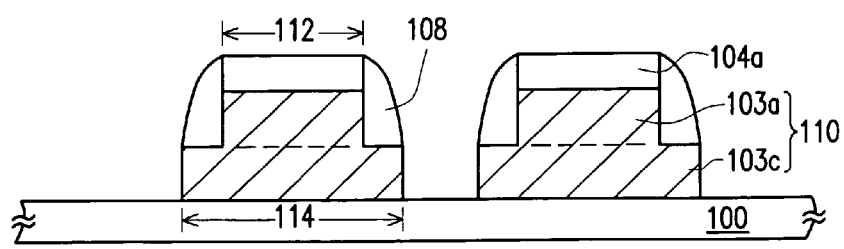

As shown in FIG. 1F, by using the spacer 108 and the patterned mask layer 104a as a mask, a portion of the conductive layer 102 is removed until the surface of the substrate 100 is exposed, so as to form conductive lines 110. At the same time, the conductive layer 103b (as shown in FIG. 1E) is transformed into a conductive layer 103c.

A conductive line structure formed by using the manufacturing method according to the present invention is described bellow.

As shown in FIG. 1F, the conductive line structure comprises two parts. One is a conductive layer 103c and the other is a conductive layer 103a. The conductive layer 103a is located over the conductive layer 103c. The line space 111 between the conductive layers 103a is different from the line space 113 between the conductive layers 103c. In addition, the line width of the conductive layer 103c is larger than that of the conductive layer 103a. That is, the line space 113 between the conductive layer 103c is narrower than the line space 111 between the conductive layers 103a. The materials of the conductive layer 103a and the conductive layer 103c can be doped polysilicon, aluminum, copper or alloys of aluminum and copper.

In one embodiment, the conductive line structure further comprises a mask layer 104a located on the conductive layer 103a. The material of the mask layer 104a can be titanium/titanium nitride, silicon oxy-nitride, silicon oxide, silicon nitride or photoresist materials.

In another embodiment, other than the mask layer 104a, the conductive line structure further comprises a spacer 108 located on the conductive layer 103c and disposed on the sidewalls of the conductive layer 103a and the mask layer 104a. The material of the mask layer 108 can be silicon oxide, silicon nitride, silicon oxy-nitride or polymer materials.

Also, as the current trend of the integrated circuit technology moves toward higher integration of the device, decreasing the line width may lead to increased sheet resistance of the conductive lines and decreased operation speed of the device. Nevertheless, in the present invention, because the spacer formed on the sidewall of a portion of the conductive layer is served as a mask during the subsequent etching process, the conductive lines possesses a relatively wide bottom portion (as shown in FIG. 1F). Therefore, the problem of increased sheet resistance due to smaller line width can be solved. Hence, the operation speed of the device is not adversely affected while the line space is decreased.

Moreover, in the integrated circuit manufacturing process, by using the novel method of the present invention, it is unnecessary to re-design the pattern of the photomask. Hence, the cost is not increased and the reliability of the manufacturing process is increased.

Furthermore, by using the spacer in the manufacturing method of the present invention, the line space between the conductive lines is decreased. Therefore, the conductive lines with a relatively narrow line space can be formed, instead of being limited by the limitations of the conventional photolithography process.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method of forming a conductive line suitable for decreasing a sheet resistance of the conductive line, the method comprising:
   providing a substrate having a conductive layer including a upper layer and a lower layer formed thereon;
   forming a mask layer on the conductive layer;
   forming a patterned photoresist layer on the mask layer;
   using the patterned photoresist layer as a mask, patterning the mask layer;
   removing the patterned photoresist layer;
   using the mask layer as a mask, patterning the portion of the upper layer of the conductive layer to form the first line of a first line width;
   forming a spacer on a sidewall of the first line and on the lower layer of the conductive layer; and
   removing a portion of the lower layer of the conductive layer not covered by the first line and the spacer to form a second line of a second line width, wherein the spacer serves as a mask.

2. The method of claim 1, wherein the method of forming the spacer comprises:
   forming a spacer material layer over the substrate; and
   performing an etching process to remove a portion of the spacer material layer.

3. The method of claim 1, wherein a material of the spacer is selected from the group consisting of silicon nitride, silicon oxide, silicon oxy-nitride and polymer materials.

4. The method of claim 1, wherein a material of the conductive layer is selected from the group consisting of doped polysilicon, aluminum, copper and alloys of aluminum and copper.

5. The method of claim 1, wherein the method of forming the conductive layer includes sputtering or chemical vapor deposition.

6. The method of claim 1, wherein the substrate includes a polysilicon layer, a dielectric layer or a metai layer.

7. The method of claim 1, wherein the material of the mask layer comprises titanium/titanium nitride, silicon oxide, silicon nitride, silicon oxy-nitride or photoresist materials.

* * * * *